United States Patent [19]

Houston et al.

[11] Patent Number: 5,185,280
[45] Date of Patent: Feb. 9, 1993

[54] METHOD OF FABRICATING A SOI TRANSISTOR WITH POCKET IMPLANT AND BODY-TO-SOURCE (BTS) CONTACT

[75] Inventors: Theodore W. Houston; Gordon P. Pollack, both of Richardson, Tex.

[73] Assignee: Texas Instruments Incorporated, Dallas, Tex.

[21] Appl. No.: 647,111

[22] Filed: Jan. 29, 1991

[51] Int. Cl.$^5$ ............................................. H01L 2/336
[52] U.S. Cl. ........................................ 437/44; 437/21; 437/30; 257/327; 257/347
[58] Field of Search ..................... 437/40, 41, 44, 27, 437/28, 29, 30, 21; 357/23.3, 23.4, 23.7

[56] References Cited

U.S. PATENT DOCUMENTS

| | | | |
|---|---|---|---|
| 4,087,902 | 5/1978 | Feltner | 437/44 |
| 4,263,057 | 4/1981 | Ipri | 437/44 |
| 4,318,216 | 3/1982 | Hsu | 437/44 |
| 4,514,897 | 5/1985 | Chiu et al. | |
| 4,597,824 | 7/1986 | Shinada et al. | 156/643 |
| 4,703,551 | 11/1987 | Szluk et al. | 437/44 |
| 4,922,315 | 5/1990 | Vu | 357/23.7 |
| 4,965,213 | 10/1990 | Blake | 437/44 |
| 5,040,037 | 8/1991 | Yamaguchi et al. | 357/23.7 |

OTHER PUBLICATIONS

Codella et al., "Submicron IGFET Device with Double Implanted Lightly Doped Drain/Source Structure", IBM Technical Disclosure Bulletin, vol. 26, No. 12, May 1984, pp. 6584-6586.
Ghandhi, *VLSI Fabrication Principles*, John Wiley and Sons, 1983, pp. 325-326.
Codella, et al., "Halo Doping Effects in Submicron DI-LDD Device Design", *International Electron Devices Meeting Technical Digest*, Dec. 1985, pp. 230-233.
Kumamoto et al., "An SOI Structure for Flash A/D Converter", *IEEE Journal of Solid-State Circuits*, vol. 23, No. 1, Feb. 1988, pp. 198-201.

*Primary Examiner*—Mary Wilczewski
*Attorney, Agent, or Firm*—Rebecca A. Mapstone; James C. Kesterson; Richard L. Donaldson

[57] ABSTRACT

A silicon-on-insulator MOS transistor is disclosed that has an implanted region of the same conductivity type as the body underneath one or both of the extended drain and source portoins of the drain and the source with and without a BTS contact or a general body contact. With only the pocket implants, the back gate threshold voltage is enhanced to reduce the possibility of back gate current flowing. With the pocket implants and a body contact, the floating body effects are minimized. Due to the BTS contact being located as far into the source as the pocket implant extends, negligible impact is made on the device channel. Ohmic connection between the source and the body is made for example by way of silicidation.

2 Claims, 9 Drawing Sheets

METHOD OF FABRICATING A SOI TRANSISTOR WITH POCKET IMPLANT AND BODY-TO-SOURCE (BTS) CONTACT

This invention was made with Government support under DNA-0090 awarded by the Defense Nuclear Agency. The Government has certain rights in this invention.

BACKGROUND OF THE INVENTION

Silicon-on-insulator (SOI) technology is becoming of increasing importance in the field of integrated circuits. SOI technology deals with the formation of transistors in a layer of semiconductor material which overlies an insulating layer. A common embodiment of SOI structures is a single crystal layer of silicon which overlies a layer of silicon dioxide. The invention to be disclosed herein is applicable to all forms of SOI including stacked as well as single layer structures. High performance and high density integrated circuits are achievable using SOI technology because of the reduction of parasitic elements present in integrated circuits formed in bulk semiconductor. For example, for an MOS transistor formed in bulk, parasitic capacitance is present at the junction between the source/drain regions and the underlying substrate, and the possibility of breakdown of the junction between source/drain regions and the substrate regions also exists. A further example of parasitic elements is present for CMOS technology in bulk, where parasitic bipolar transistors formed by n-channel and p-channel transistors in adjacent wells can give rise to latch-up problems. Since SOI structures significantly alleviate parasitic elements, and increase the junction breakdown tolerance of the structure, the SOI technology is well-suited for high performance and high density integrated circuits.

This invention applies to transistors built on all forms of Silicon On Insulator including, for example, heteroepitaxy, such as SOS, beam recrystallization, epitaxial lateral overgrowth, lateral solid phase epitaxy, and single silicon separation (e.g. SIMOX and FIPOS).

The underlying insulator film in an SOI structure presents certain problems relative to the transistor characteristics, however. In bulk transistors, electrical connection is easily made via the substrate to the body node of an MOS transistor. The relatively fixed bias of the body node provides for a stable threshold voltage relative to the drain to source voltage. However, conventional SOI transistors have the body node (i.e., the undepleted volume within the body region underlying the gate electrode) electrically floating, as the body node is isolated from the substrate by the underlying insulator film. Under sufficient drain-to-source bias, impact ionization can generate electron-hole pairs near the drain which, due to the majority carriers traveling to the body node while the minority carriers travel to the drain, cause a voltage differential between the body node and the source of the transistor. This voltage differential lowers the effective threshold voltage and increases the drain current, exhibiting the well known "kink" effect. The "kink" effect is exhibited in the I/V characteristics of transistors by an actual "kink" in the curves.

Furthermore, the structure of the SOI transistor presents a parasitic "back channel" transistor, with the substrate as the gate and the insulator film underlying the transistor as the gate dielectric. This back channel may provide for a drain-source leakage path along the body node near the interface with the insulator film. In addition, the dielectrically isolated body node allows capacitive coupling between the body node and the source and the drain, and diode coupling between the body node and the source and drain, to bias the body node and thus affect the threshold voltage. Each of these factors can contribute to undesirable shifts in the transistor relative to design, as well as to increased instability of the transistor operating characteristics.

It is therefore an object of this invention to provide an insulated-gate field effect transistor formed in semiconductor region overlying an insulator, having reduced resistance from body contact to remote regions of the body.

It is also an object of this invention to provide an insulated-gate field effect transistor formed in semiconductor region overlying an insulator, having a higher back channel Vt while maintaining desired front channel characteristics.

DETAILED DESCRIPTION OF THE PREFERRED EMBODIMENTS

Figure 1:
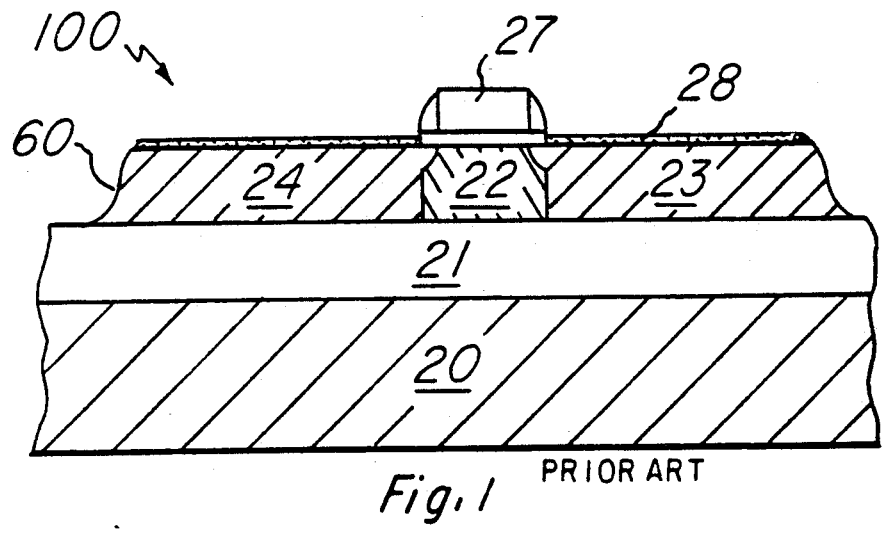
FIG. 1 is a cross sectional view of a conventional SOI MOS transistor.

The floating body node of SOI transistor 100 presents certain problems in the performance, and performance stability, of the transistor. A first problem is the problem of a parasitic "back channel" transistor, having substrate 20 as a gate electrode and insulator film 21 as the gate dielectric. This back channel may provide for a drain-to-source leakage path along the body node 22 near the interface with insulator film 21, depending upon the local potential of substrate 20 at the transistor location. In addition, it is well known that the voltage of body node 22 will effect the threshold voltage of the transistor. While in bulk devices the MOS transistor body nodes are biased by the substrate, the dielectrically isolated body node 22 of transistor 100 of FIG. 1 allows capacitive coupling between body node 22 and gate electrode 27, and diode coupling between body node 22 and source and drain regions 23 and 24, to bias body node 22 to an undesired potential. Furthermore, impact ionization occurs when carriers near the drain are at a sufficiently high potential that electron-hole pairs are created. Due to minority carriers traveling to the source while the majority carriers travel to the drain, these electron-hole pairs cause a voltage differential between body node 22 and source region 23, lowering the effective threshold voltage and increasing the drain current(i.e., the well known "kink" effect).

Figure 2:
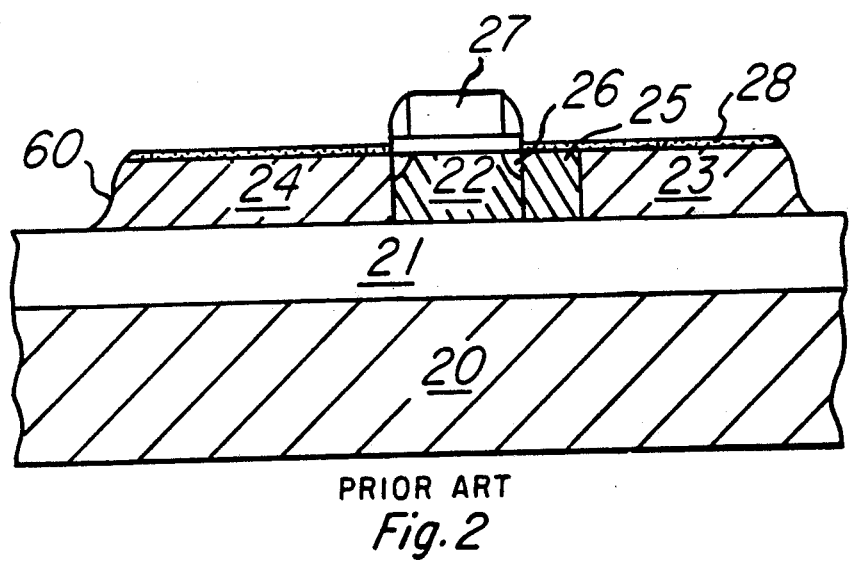
FIGS. 2 and 2a are cross sectional and plan views of a prior art source to body contact SOI MOS transistor.
Figure 2A:
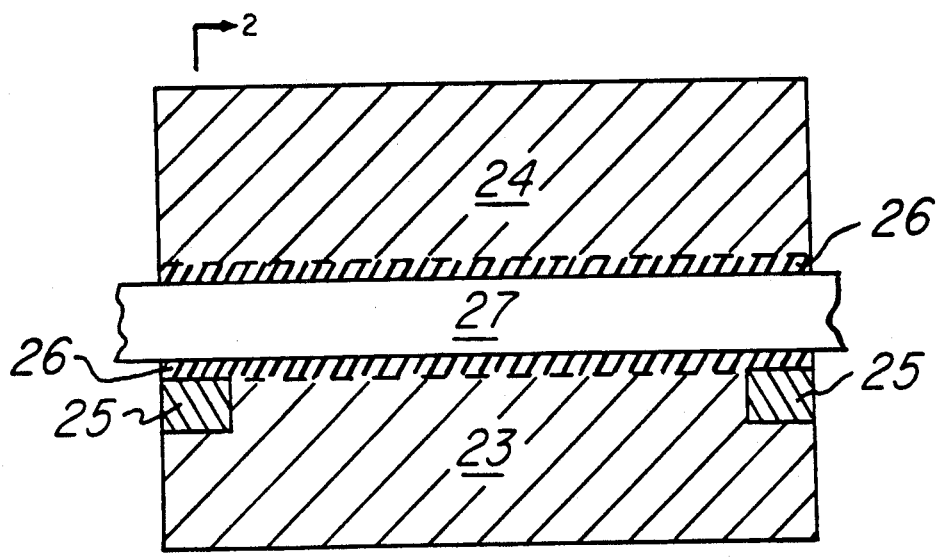

One way to make contact between the source and body is to highly dope a contact region 25 of a conductivity type opposite that of the source and drain adjacent to the body node 22. Contact to the surface of region 25 will then make contact to the body node. If the contact region is on the source side of the gate electrode as shown in FIG. 2, then the body node can be connected to the source node by silicidation of the surface as described below. This is referred to as a body-tied-to-source (BTS) contact. If not connected to the source region by silicide, this contact region (25) can be used as a general body contact. Throughout the remainder of the Figures, like reference numerals will be used to refer to like elements as used in the conventional transistor 100 of FIG. 1. The contact region may be formed by known techniques, such as implant and diffusion, in a self-aligned fashion after the provision of sidewall filaments along the side of the gate 27, extending below the lightly doped drain region 26 on the source side of the transistor. The source region 23 and the body node contact region 25 can then be connected together by way of silicidation at the surface 28 of the structure, thereby connecting the source region to the body node. Although the body voltage is controlled at the points where the body contact implants are in the transistor, there is resistance to other parts of the body.

Another method of body contact is tank formation of the transistor where the tank surrounds the source and drain wells and makes contact to the body.

Figure 3:
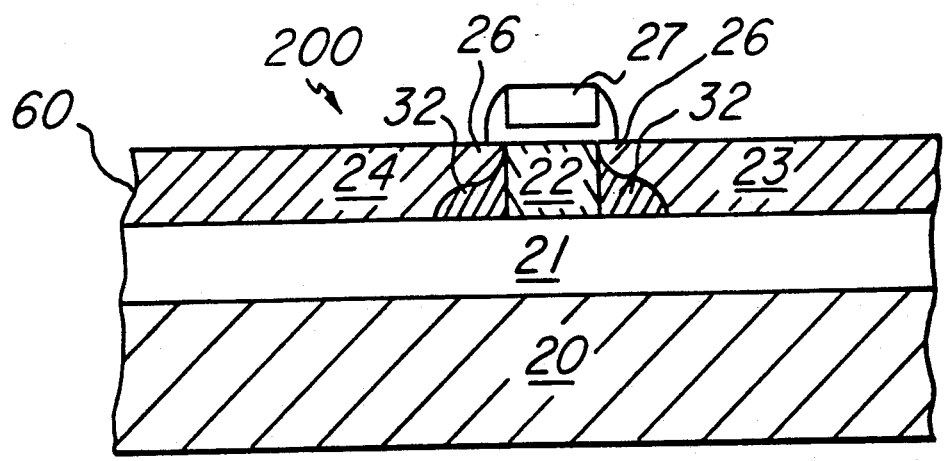
FIGS. 3 and 3a are cross sectional and plan views of an SOI MOS transistor according to the invention.
Figure 3A:
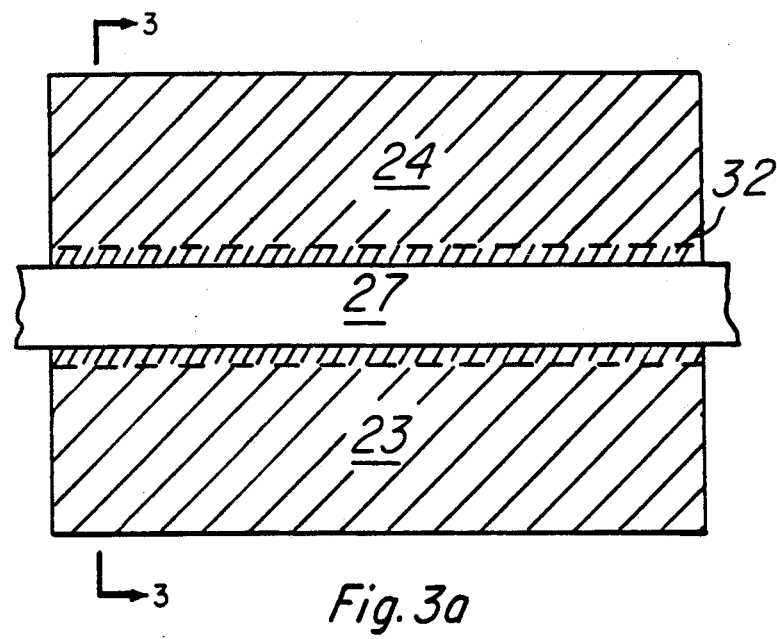

The present invention, does not require additional area and actually reduces the resistance across the width of the channel. The following discussion refers to an SOI type transistor. It will be appreciated by those skilled in the art that the instruction is applicable to a broad variety of SOI, for example, heteroepitaxy, such as SOS, beam or laser recrystalization, epitaxial lateral overgrowth, lateral solid phase epitaxy, polysilicon, bond and etch back, and single silicon separation (e.g. SIMOX and FIPOS). This invention is also applicable to other semiconductor materials, e.g. Ge, on insulator. As shown in FIGS. 3 and 3a, an SOI transistor 200 formed with a heavier dose of an implant of the same conductivity type as the body type underneath the source and drain extensions 26 in the body 22 of the device. The pocket implants 32, traverse the full width of the device as shown in FIG. 3a, reducing the resistance from a body contact across the width of the device. The drain and source extensions 26 are not shown in the view of FIG. 3a, in order to show the presence of the pocket implants 32.

Figure 15:
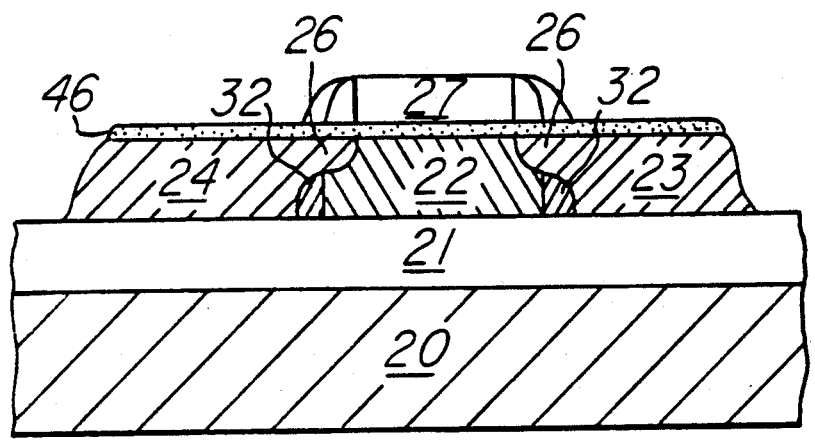
FIG. 15 is a cross-sectional view of an alternate embodiment of an SOI MOS transistor according to the invention with recessed pocket implants.
Figure 16:
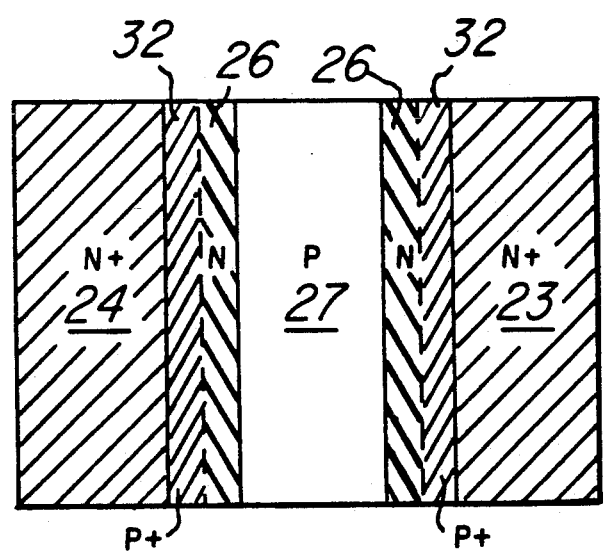
FIG. 16 is the plan view of an alternate embodiment of an SOI MOS transistor according to the invention with recessed pocket implants.

One embodiment of the invention is to lightly-dope the drain extension 26 and deliberately extend the LDD (lightly-doped drain) and the pocket implant 32 at the same time to effectively lengthen the back gate channel. The longer the channel, the less likely the back gate channel will conduct. It is desirable to maintain a low front gate threshold voltage to achieve maximum current drive capability, while it is also desirable to maintain high back channel Vt to minimize leakage, especially with radiation. By pocketing the heavy doping of the body underneath the drain extension, the low front gate threshold voltage is maintained while the back gate threshold voltage can be increased. In order to further reduce the influence of the pocket implant on the front channel characteristics, the pocket implant can be recessed relative to the source and/or drain extension as shown in FIG. 15. FIG. 16 shows the plan view of the transistor as constructed in FIG. 15. The sidewall oxide filaments are not shown in FIG. 16 to illustrate the LDD (26) and pocket implant (32) orientations.

Figure 4:
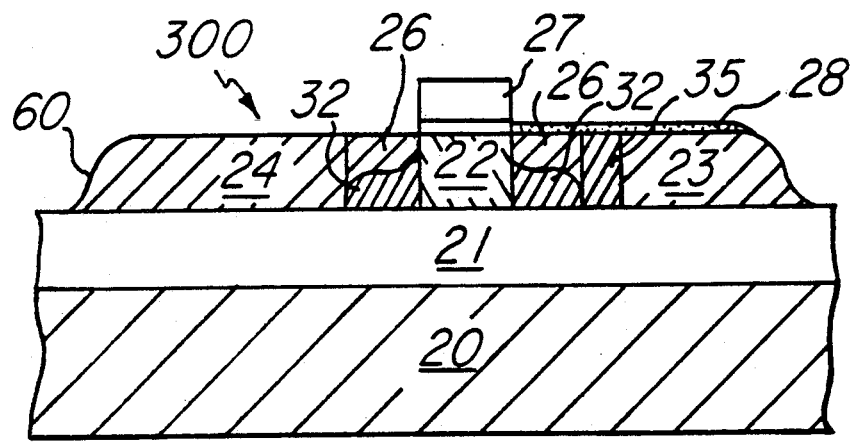
FIGS. 4 and 4a are cross sectional and plan views of an alternate embodiment of an SOI MOS transistor according to the invention with BTS contacts.
Figure 4A:
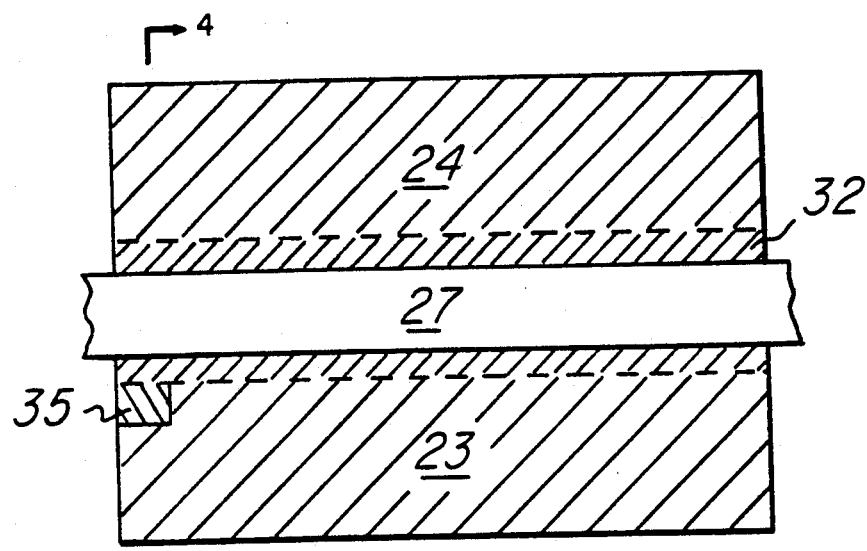

If a body-tied-to-source contact (BTS) 35 is dispositioned between the LDD 26 and the pocket implant 32 on one side and the source 23 on the other side and composed of the same conductivity as the pocket implant, through silicidation 28 on the surface, contact between the body and the source can be made reducing floating body effects. Transistor 300 is shown in FIG. 4. Since the contact region is of the same conductivity as the body node, a non-rectifying ohmic contact is made between source 23 and body 22 nodes of the transistor. Dispositioning the BTS contact deep into the source region, as made possible by the extent of the pocket implant, will also help keep the contact from affecting the channel. This structure can also be used for general body contact (i.e. not tied to the source) if the surface is not silicided. In this structure, the source extension can be made longer than normally used for LDD in order to more fully remove the surface contact from the channel.

A third embodiment is the masking of at least a portion of the pocket implant to the pocket on the source side only whereby extra heavy doping could be used to the point of creating a leaky source-body junction. The leaky junction would effectively insure control of the body voltage through the source effecting the reduction in floating body effects.

Figure 14:
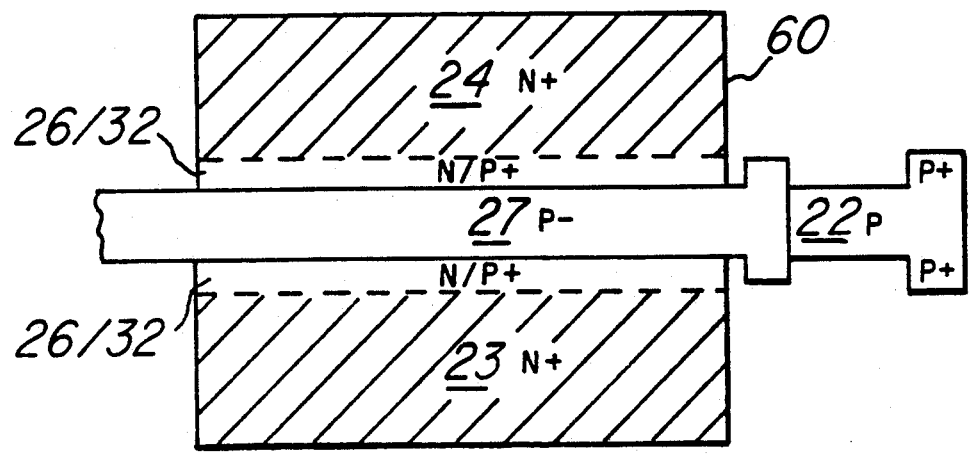
FIG. 14 is the plan view of the contact from the edge SOI transistor embodiment.

Contact from the edge, as shown in FIG. 14, is another embodiment and method of controlling the body voltage. The n/p+ region lying on either side of the gate electrode represents the LDD region (26) towards the top of the transistor and the pocket implant (32), lying directly underneath the LDD, towards the base of the transistor. The body is elongated at the edge of the transistor and a contact is made to the body. This can be used whether the body is tied to the source or to an external voltage.

Figure 5:
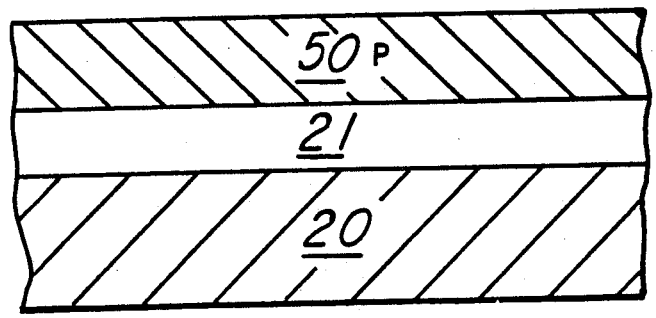
FIG. 5 is the silicon on insulator starting wafer that this invention embodies.
Figure 6:
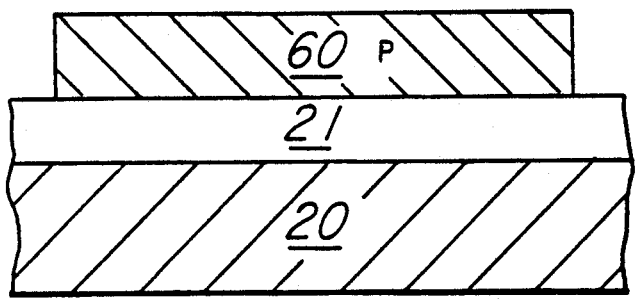
FIG. 6 illustrates the SOI transistor constructed according to this invention after the mesa has been formed post patterning and etching of the silicon.
Figure 7:
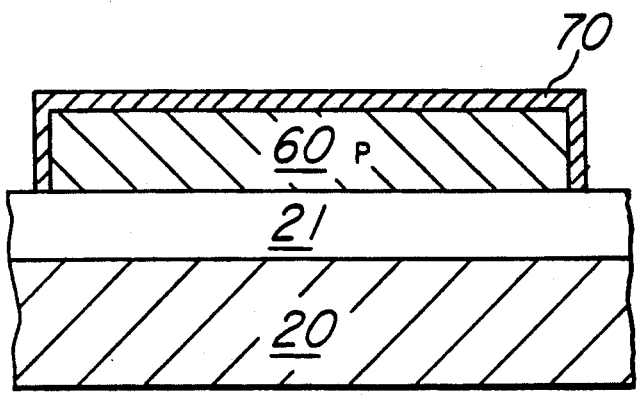
FIG. 7 shows the SOI transistor constructed according to this invention after the gate oxide has been deposited on the mesa.
Figure 8:
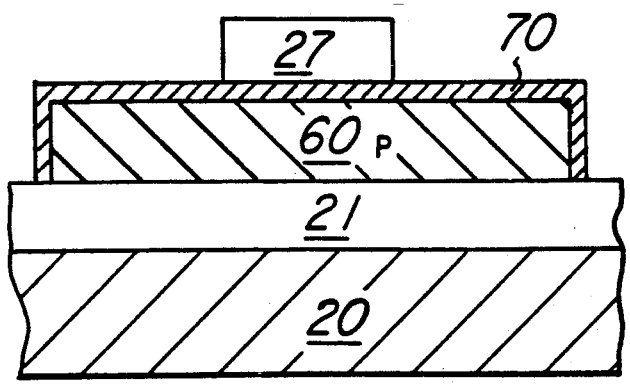
FIG. 8 shows the SOI transistor constructed according to this invention after the gate electrode has been formed.
Figure 9:
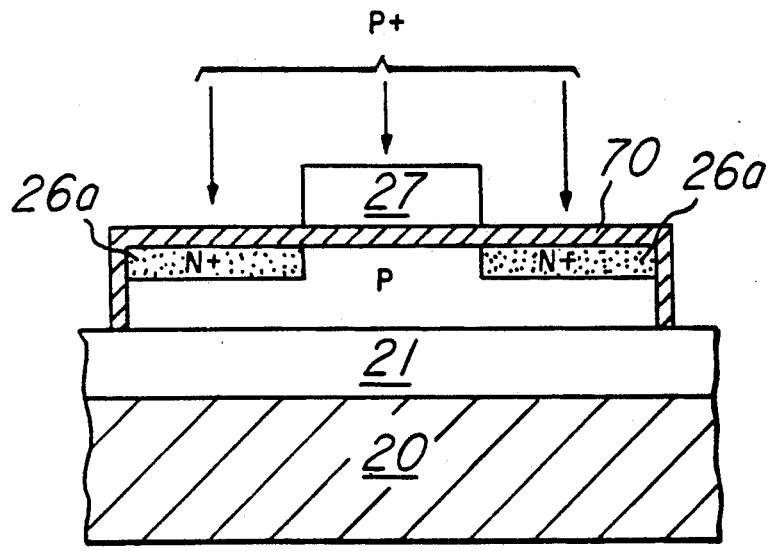
FIG. 9 illustrates the SOI transistor constructed according to this invention during the implantation of the lightly doped source and drain extensions.
Figure 10:
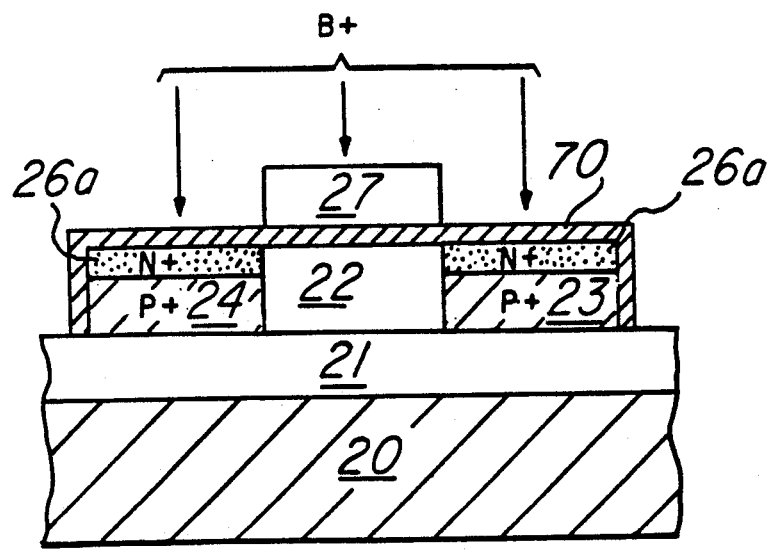
FIG. 10 illustrates the SOI transistor constructed according to this invention during the implantation of the "pockets" lying directly underneath the source and drain extensions.
Figure 11:
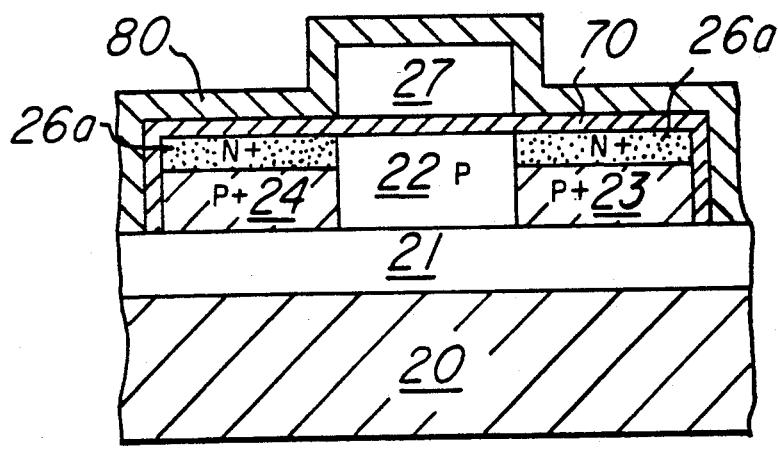
FIG. 11 is the SOI transistor constructed according to this invention after the sidewall oxide filament layer has been deposited.
Figure 12:
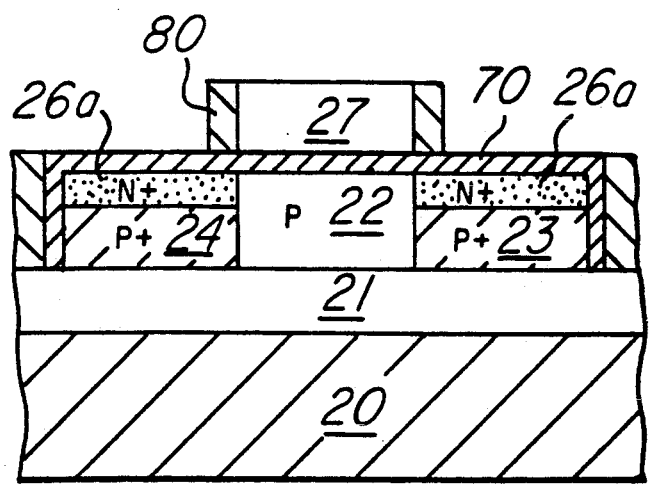
FIG. 12 is the SOI transistor constructed according to this invention after the sidewall oxide filament has been etched.
Figure 13:
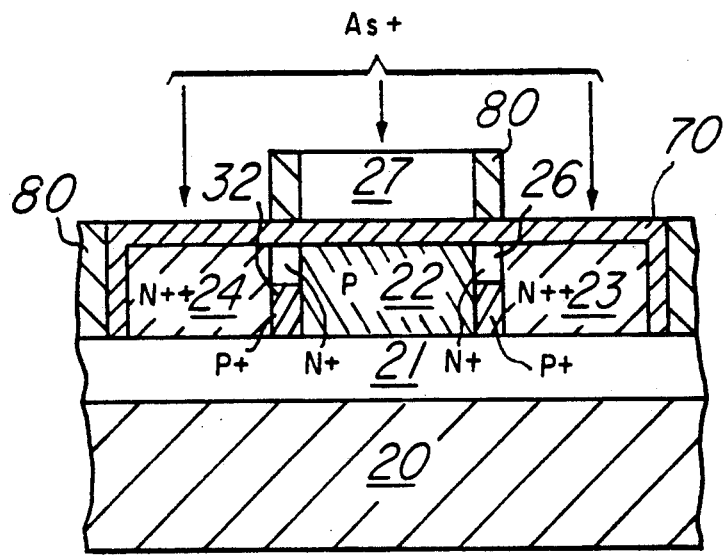
FIG. 13 is the SOI transistor constructed according to this invention after the source and drain implants have been made.

Referring now to FIGS. 5 through 13 transistor 300 constructed according to the preferred embodiment is illustrated. FIG. 5 shows the basic silicon-on-oxide starting wafer consisting of a silicon substrate and a P doped, of a first conductivity type, silicon layer, 20 and 50 respectively, separated by an insulating oxide layer 21. FIG. 6 is the result of patterning and etching the silicon layer 50 to form the mesa 60. FIG. 7 illustrates the application of the gate oxide 70 prior to the deposition, pattern and etch of the gate 27 as shown in FIG. 8. FIG. 9 illustrates the implantation of lightly doped phosphorus source and drain 26a which will become the lightly doped source and drain extensions 26, LDD, doped with a second conductivity type, N+. Next, implantation of a deep boron "halo" of a first conductivity type, P+, creates high concentrations of P+ in the source and drain regions as shown in FIG. 10. This dopant defines the conductivity type of the pocket implant. It should be noted that areas which will become the source and drain regions will be counterdoped in later steps with a dopant of the second conductivity type. FIGS. 11 and 12 illustrate the subsequent steps of depositing and etching the conformal sidewall oxide 80 to form the spacers used to mask the pocket implantations 32 and the lightly doped source and drain regions 26 from the deep source and drain implantations. FIG. 13 completes the doping with the implantation and annealing of heavy concentrations of the second conductivity type, N+, in the source 23 and drain 24 regions which effectively defines the LDD 26 and pocket implantations 32. Conventional metallization processing follows forming the contacts. It should be understood that the specific species P+ and boron are used as an example. Other species or combination of species can be used. For example, the P+ can be replaced by arsenic or a combination of arsenic and phosphorus. Also, the complementary structure can be accomplished.

I claim:

1. A method of fabricating an integrated circuit comprising a field effect transistor having source and drain regions in a semiconductor layer overlying an insulting film, comprising the steps of:

patterning and etching of a mesa on an SOI wafer;
depositing of a gate oxide layer over the mesa;
depositing, patterning and etching to form a gate electrode having sidewalls;
lightly doping said source and drain regions with a dopant of a first conductivity type to form lightly-doped regions;
heavily doping said source and drain regions with a dopant of a second conductivity type;
depositing and etching oxide to form conformal sidewall spacers;
adjacent the sidewalls of the gate electrode;
doping source and drain regions with heavy concentrations of a dopant of the first conductivity type to form heavily-doped regions;
heavily doping an area in the source region spaced from the gate electrode with a dopant of the second conductivity type in the source region, said area dispositioned between a lightly-doped region on one side and a heavily-doped region on another side; and
depositing of metallization contacts.

2. The method of claim 1, wherein said doping steps comprise: implanting dopant ions of said first conductivity type or of
said second conductivity type; and annealing to diffuse the implanted ions.